(12) United States Patent
Koricic et al.

(10) Patent No.: US 9,842,834 B2
(45) Date of Patent: Dec. 12, 2017

(54) HORIZONTAL CURRENT BIPOLAR TRANSISTORS WITH IMPROVED BREAKDOWN VOLTAGES

(71) Applicants: Marko Koricic, Zagreb (HR);
Tomislav Suligoj, Zagreb (HR)

(72) Inventors: Marko Koricic, Zagreb (HR);
Tomislav Suligoj, Zagreb (HR)

(*) Notice: Subject to any disclaimer, the term of this patent is extended or adjusted under 35 U.S.C. 154(b) by 0 days.

(21) Appl. No.: 14/976,461

(22) Filed: Dec. 21, 2015

(65) Prior Publication Data

US 2017/0179220 A1 Jun. 22, 2017

(51) Int. Cl.
| H01L 21/8248 | (2006.01) |
| H01L 27/06 | (2006.01) |
| H01L 29/06 | (2006.01) |
| H01L 29/735 | (2006.01) |

(52) U.S. Cl.
CPC ........ *H01L 27/0623* (2013.01); *H01L 29/063* (2013.01); *H01L 29/0646* (2013.01); *H01L 29/0649* (2013.01); *H01L 29/0696* (2013.01); *H01L 29/735* (2013.01)

(58) Field of Classification Search
CPC .............. H01L 29/063; H01L 27/0623; H01L 29/0646; H01L 29/0649; H01L 29/0696; H01L 29/735
See application file for complete search history.

(56) References Cited

U.S. PATENT DOCUMENTS

| 7,038,249 B2 | 5/2006 | Suligoj | |
| 7,906,403 B2 * | 3/2011 | Donkers | ........... H01L 29/66242 257/526 |
| 8,569,866 B2 | 10/2013 | Suligoj | |

OTHER PUBLICATIONS

Tomislav Suligoj et al, "A New HCBT with a Partially Etched Collector", IEEE Electron Dev. Letters, vol. 26, No. 3, pp. 200-202, Mar. 2005.
Tomislav Suligoj et al, "Horizontal Current Bipolar Transistor (HCBT) with a Single Polysilicon Region for Improved High-Frequency Performance of BiCMOS ICs", IEEE Electron Dev. Letters, vol. 31, No. 6, pp. 534-536, Jun. 2010.

(Continued)

*Primary Examiner* — Fei Fei Yeung Lopez
(74) *Attorney, Agent, or Firm* — Shalini Venkatesh

(57) ABSTRACT

A horizontal current bipolar transistor comprises a substrate of first conductivity type, defining a wafer plane parallel to said substrate; a collector drift region above said substrate, having a second, opposite conductivity type, forming a first metallurgical pn-junction with said substrate; a collector contact region having second conductivity type above said substrate and adjacent to said collector drift region; a base region comprising a sidewall at an acute angle to said wafer plane, having first conductivity type, and forming a second metallurgical pn-junction with said collector drift region; and a buried region having first conductivity type between said substrate and said collector drift region forming a third metallurgical pn-junction with the collector drift region. An intercept between an isometric projection of said base region on said wafer plane and an isometric projection of said buried region on said wafer plane is smaller than said isometric projection of said base region.

15 Claims, 11 Drawing Sheets

(56) References Cited

OTHER PUBLICATIONS

Marko Koricic et al, "Double-Emitter HCBT Structure—A High-Voltage Bipolar Transistor for BiCMOS Integration", IEEE Trans. Electron Devices, vol. 59, No. 12 pp. 3647-3650, Dec. 2012.
J.A. Appels et al, "High Voltage Thin Layer Devices (RESURF Devices)", in IEDM Tech. Dig., 1979, pp. 238-241.
Jin Cai et al, "Vertical SiGe-Base Bipolar Transistors on CMOS-Compatible SOI Substrate", Proceedings of the Bipolar/BiCMOS Circuits and Technology Meeting, pp. 215-218., Sep. 2003.
Marko Koricic et al, "Double-Emitter Reduced-Surface-Field Horizontal Current Bipolar Transistor With 36 V Breakdown Integrated in BiCMOS at Zero Cost", IEEE Electron Dev. Letters, vol. 36, No. 2, pp. 90-92, Feb. 2015.

* cited by examiner

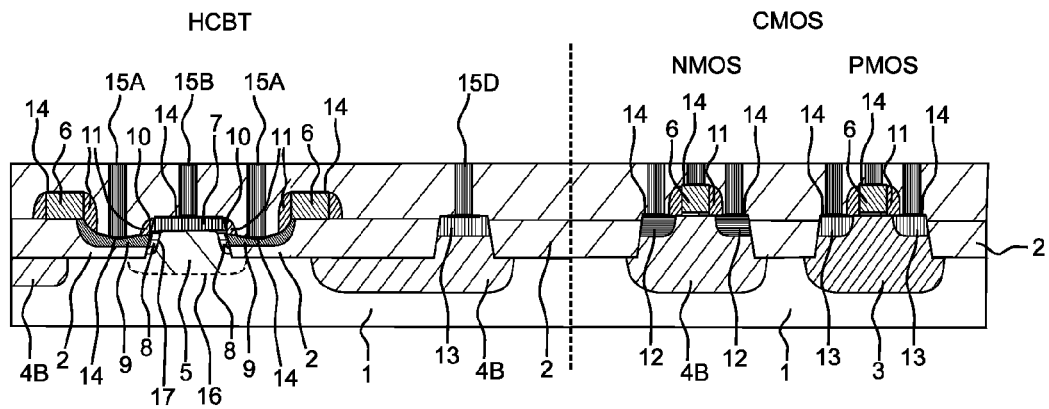
FIG.6A
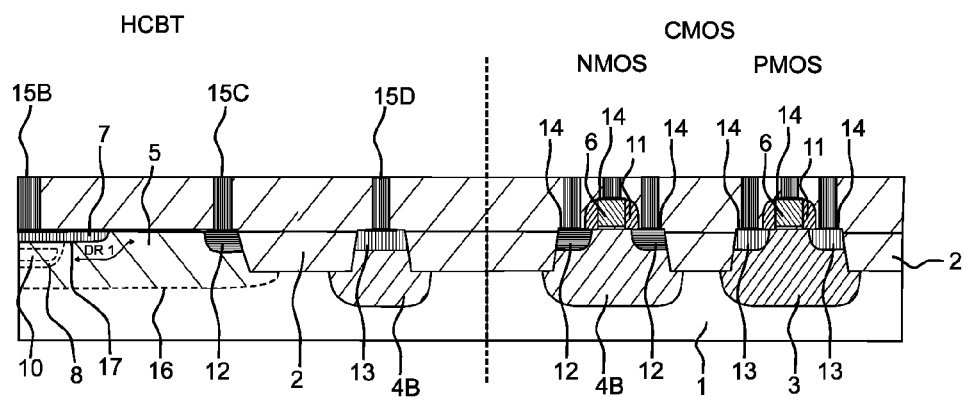
FIG.6B
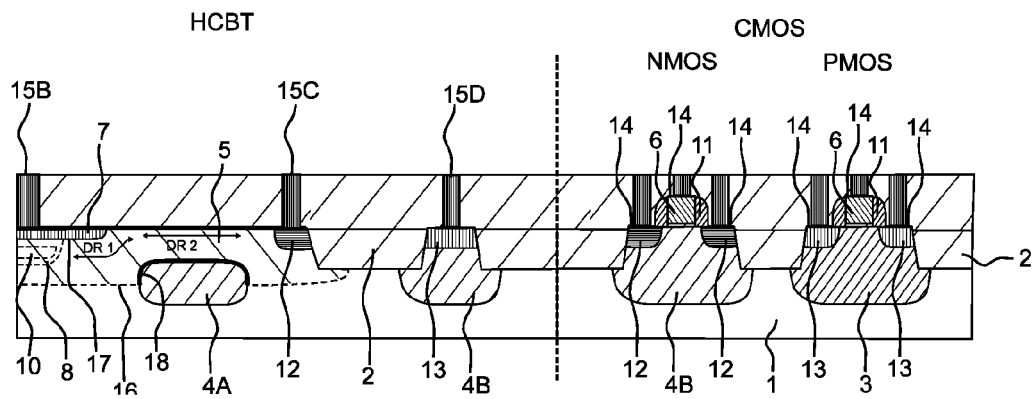

HORIZONTAL CURRENT BIPOLAR TRANSISTORS WITH IMPROVED BREAKDOWN VOLTAGES

BACKGROUND

Integration of bipolar transistor into CMOS technology results in a BiCMOS technology that offers higher flexibility in circuit design. BiCMOS technology offers increased functionality of the chips allowing for system on chip integration. Wireless communications represent large portion of consumer electronics market which is very sensitive to the cost of the product. Therefore, RF systems can gain benefits from integration of bipolar and CMOS technologies. In order to achieve the ability of system on chip integration, BiCMOS technology has to offer bipolar devices with different characteristics. In general, there is always tradeoff between speed and the breakdown voltage of the transistor. According to International Technology Roadmap for Semiconductors (ITRS), bipolar devices optimized for high speed, for high breakdown voltage and intermediate type of devices are needed for RF system on chip integration. In vertical bipolar transistors this is usually accomplished by different parameters of selectively implanted collector (SIC) for different types of transistors. This approach requires additional lithography masks and increases the complexity of the process and overall cost.

Vertical bipolar transistors are mainstream bipolar structures for BiCMOS integration. Process modules inserted in CMOS needed for bipolar transistor processing are as follows: deep trench isolations, buried collector layer, epitaxial collector region, collector plugs, base polysilicon layer, emitter base spacers, emitter polysilicon layer etc. Bipolar transistor can be made less complex by avoiding some of the mentioned process steps but at penalty of degraded electrical characteristics. On the other hand, additional process steps can be added such as Si/SiGe epi-base or raised extrinsic base in order to improve the performance. In general, processes are developed in the way that they are optimized as a cost performance or high performance processes.

Lateral bipolar transistors (LBTs) are also integrated into CMOS and are mainly realized on SOI wafers. In general, they require less additional steps to CMOS processing since the isolation is realized with buried oxide. Reduced process complexity and small parasitic capacitances make them attractive for low-power SOI BiCMOS applications. The drawback of the technology is use of SOI substrates which are more expensive as well as the processing of the intrinsic transistor which results in unoptimized doping profiles and characteristics that are inferior compared to vertical transistors.

The Horizontal Current Bipolar Transistor (HCBT) technology is demonstrated in U.S. Pat. No. 7,038,249 [1]. HCBT has a lateral arrangement of the intrinsic transistor, in the same way as in LBTs. However, the intrinsic transistor is processed on the sidewall of the silicon pillar or hill, obtained by etching, making it possible to have the optimized doping profiles in the intrinsic transistor. HCBT electrical characteristics are comparable to the characteristics of vertical bipolar transistors, with a considerable improvement over the LBTs, as has been reported in the literature [2]. Additionally, due to lateral arrangement of the intrinsic transistor, parasitic capacitances are smaller compared to vertical transistors. Furthermore, processing does not require deep trenches, epitaxial collector region, buried collector layer, collector plugs and base polysilicon layer. If HCBT structure is integrated into the BiCMOS technology, the integration requires a lower number of process steps to be added to CMOS technology. Moreover, the HCBT is normally processed by using bulk silicon substrate, but the HCBT concept can also be applied to SOI substrates. The simplified technology and the use of bulk silicon substrate make the HCBT technology a low-cost and simultaneously a high-performance solution for BiCMOS integration.

Integration of HCBT with standard 0.18 µm CMOS technology is published in [3]. HCBT structures for BiCMOS integration include high-speed (HS) [4] and high-voltage (HV) devices [5], which increases the flexibility of technology.

BRIEF DESCRIPTION OF THE FIGURES

FIG. 6A: Cross-section view at one position of a transistor according to one embodiment.

FIG. 6B: Cross-section view at another position of a transistor according to one embodiment.

FIG. 6C: Cross-section view at yet another position of a transistor according to one embodiment.

DESCRIPTION OF THE INVENTION

Figure 1:
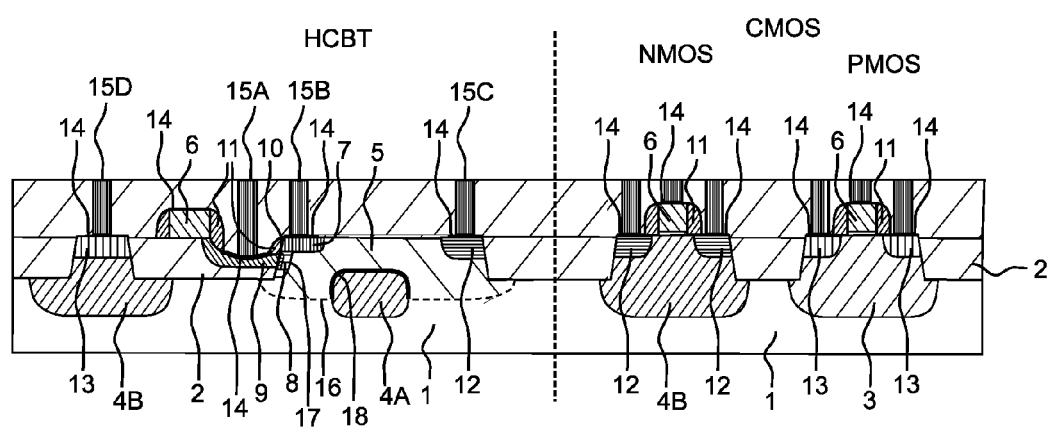
FIG. 1: Schematic cross-section view of a SE HCBT with local substrate according to one embodiment.

HV HCBT is based on the double-emitter HCBT structure. Increase in the collector-emitter breakdown voltage with open base ($BV_{CEO}$) is achieved by merging collectors of two HS HCBT transistors with opposite orientation of the intrinsic transistors. This geometry allows full depletion of the intrinsic collector in forward active region resulting in the increase of $BV_{CEO}$ to the value close to collector-base breakdown voltage with open emitter ($BV_{CBO}$).

This invention presents the new structure and method for fabrication of HCBT devices with high breakdown voltage by utilizing the substrate-collector junction field to achieve full depletion of the collector region. This principle is similar to the one used in REduced SURface Field (RESURF) devices [6]. Electric field is not necessarily reduced at the surface but at the plane where electric charges are geometrically limited. In general, charge can be limited by isolation material such as in [6, 7] or by opposing pn-junction such as in [5]. If electric charge of one side of the pn-junction is limited geometrically, maximum electric field at the junction is limited by the total amount of charge on that side. Maximum is reached when full depletion of this side of junction occurs.

One way of increasing the $BV_{CEO}$ of bipolar transistor is to apply aforementioned effect to limit the electric field at the intrinsic base-collector junction below critical value for avalanche multiplication. Therefore, intrinsic collector has to be fully depleted before field at the junction reaches the critical value. Once intrinsic collector is fully depleted, field at the junction remains roughly constant. When electrons (in case of npn transistor) pass through the base-collector junction, direction of the electric field forces them to flow through the drift region, i.e. the region with reduced electric field. In case of DE HCBT the intrinsic collector is surrounded by the base region, which is the most important for full depletion of collector [5]. In case of the proposed HCBT structures, local substrate with increased doping concentration is placed near the intrinsic transistor. In this way collector charge is limited and the full depletion of collector region accomplished when transistor is operated in forward active region.

This principle can be applied on both single emitter (SE) and double-emitter (DE) HCBTs. Collector charge is limited in different part of collector for two structures, yielding different values of $BV_{CEO}$. In case of SE HCBT, substrate-collector junction is used to deplete intrinsic collector in order to limit the electric field at the intrinsic base-collector junction. A drift region which sustains collector voltage is formed toward the extrinsic collector. In case of DE HCBT it is used to deplete portion of extrinsic collector in order to limit the peak electric field in the drift region of DE HCBT, which is responsible for transistor breakdown. The second drift region is formed, which sustains collector voltage increasing the $BV_{CEO}$.

HCBT is fabricated in bulk silicon p-type wafers with the acceptor concentration around $10^{15}$ cm$^{-3}$. With this doping concentration in the substrate it is difficult to deplete collector which has the concentration on the order of $10^{17}$ cm$^{-3}$. In order to have efficient depletion action from the substrate, it should have the concentration on the same order of magnitude as in the collector or higher. CMOS pwell has a suitable concentration and can be used to form the local substrate region, which can be used to introduce collector charge sharing. Moreover, since HCBT is integrated with CMOS this process module is already available resulting in no additional costs.

I. The First Embodiment

In the first embodiment, the local pwell substrate-collector junction 18 is used to change the electric field distribution of the SE HCBT. Cross-section of the SE HCBT with local substrate is shown in FIG. 1. The structure is similar to the reported single polysilicon region HCBT [3, 4]. The only difference is that the CMOS pwell implant is used to fabricate a local pwell substrate region 4A extending for a certain distance opposite to the intrinsic base 8 below the extended silicon island 5, representing the portion of the extrinsic collector. As shown in FIG. 1, the local pwell substrate does not extend all the way below the intrinsic base. This can be geometrically defined by using the isometric projections on the wafer surface defining the wafer plane. Therefore, the intercept between an isometric projection of a base layer comprising an extrinsic base layer, an intrinsic base layer, and a sidewall inclined at an acute angle to said wafer plane and an isometric projection of said buried local pwell substrate on said wafer plane is smaller than said isometric projection of said base layer.

Figure 2A:
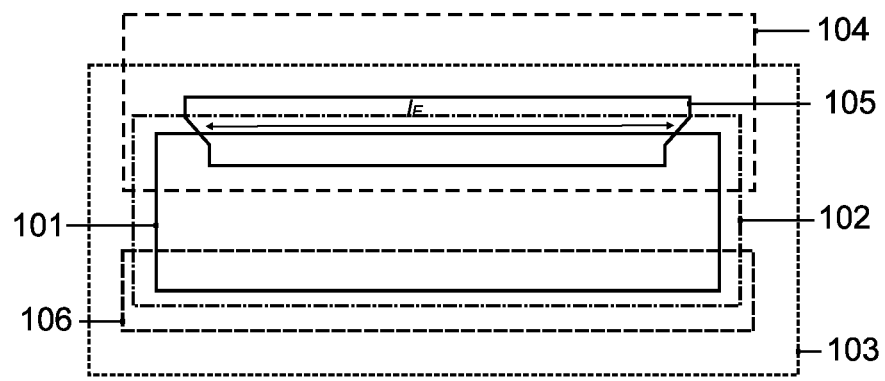
FIG. 2A: One example of a lithography mask for one embodiment.
Figure 2B:
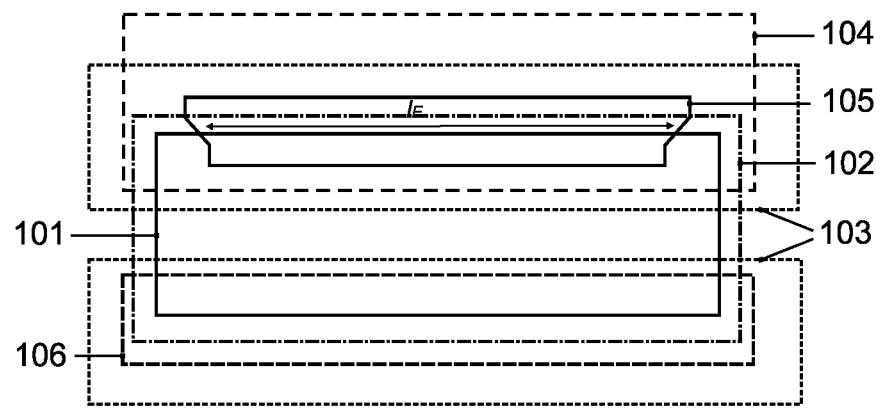
FIG. 2B: Another example of a lithography mask for one embodiment.

Lithography masks important for the SE HCBT and high-voltage (HV) SE HCBT fabrication are shown in FIGS. 2A and 2B respectively. Standard HCBT process is described in [3, 4]. Transistors are fabricated in the silicon islands, called n-hills 5, which are defined by the shallow trench isolation (STI) using a CMOS active mask 101. The n-hill is implanted by using n-hill mask 102 during CMOS well implantations. The pwell regions 4A and 4B are obtained by using a CMOS pwell blocking mask 103 meaning that the pwell is implanted in the area not covered by the mask 103 shown in FIG. 2A and FIG. 2B. The CMOS pwell implant is also used for the isolation of HCBT devices as a channel stopper shown in FIG. 1, which forms a guard-ring around transistor. Oxide etching mask 105 is used for the formation of an emitter trench and it defines the length of the emitter ($l_E$) which extends out of plane in the cross-section of FIG. 1. Base mask 104 and CMOS n$^+$ collector mask 106 are used for intrinsic/extrinsic bases and n$^+$ diffusion layer 12 implantations, respectively. The local pwell substrate 4A can be extended all the way below the n+ diffusion layer but better electrical performance is achieved if it is not extended. If the local pwell substrate 4A is not extended below the n+ diffusion layers then the intercept between an isometric projection of said n+ diffusion layer on said wafer plane and an isometric projection of said buried local pwell substrate on wafer plane is smaller than said isometric projection of said n+ diffusion layer. Standard CMOS contacts processing is used and masks are omitted from FIGS. 2A, 2B and 2C. Collector contact 15C and n+ diffusion layer 12 make up a region defined as the collector contact region.

In the forward active region, the collector is connected to a higher potential than the base and the substrate is connected to the lowest potential. Both the base-collector and the collector-substrate junctions are reversely polarized and associated depletion regions spread on the intrinsic collector side. A portion of n-hill layer 5 positioned between intrinsic base 8 and local pwell substrate 4A and below the extrinsic base 7 acts as an intrinsic collector. Once the intrinsic collector is fully depleted, penetration of the collector electric field toward intrinsic base is blocked by the extrinsic base from the top and the local pwell substrate from the bottom. As a result, a voltage drop across the intrinsic base-collector junction is limited as well as the maximum electric field. It also results in the suppression of the basewidth modulation by the collector voltage.

Figure 2C:
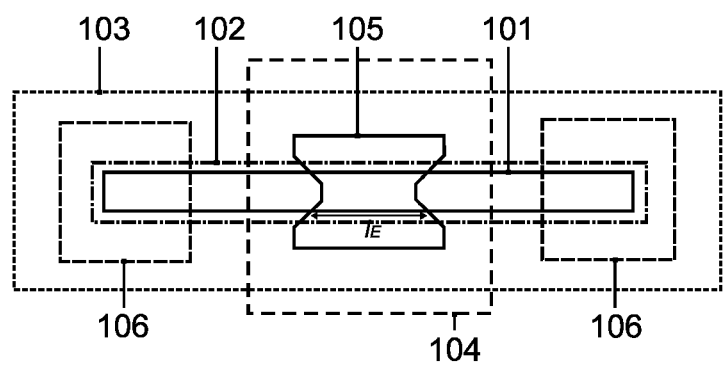
FIG. 2C: Yet another example of a lithography mask for one embodiment.

In the DE HCBT whose mask is shown in FIG. 2C electrons are flowing from the emitter and then they turn toward the extrinsic collector traveling laterally through the fully depleted intrinsic collector. Therefore, $l_E$ from FIG. 2C should be kept small to reduce the base-collector depletion region transit time and to maintain good high frequency performance. If a higher collector current drive is needed for circuit operation, transistors of unit size should be connected in parallel. In case of the HV SE HCBT depletion of the intrinsic collector occurs in a cross-section shown in FIG. 1 and base-collector depletion region transit time is independent of $l_E$ from FIG. 2B. Hence, the higher current drive can be easily obtained by increasing the $l_E$ giving more flexibility in the layout design.

Electrical Characteristics

Figure 3:
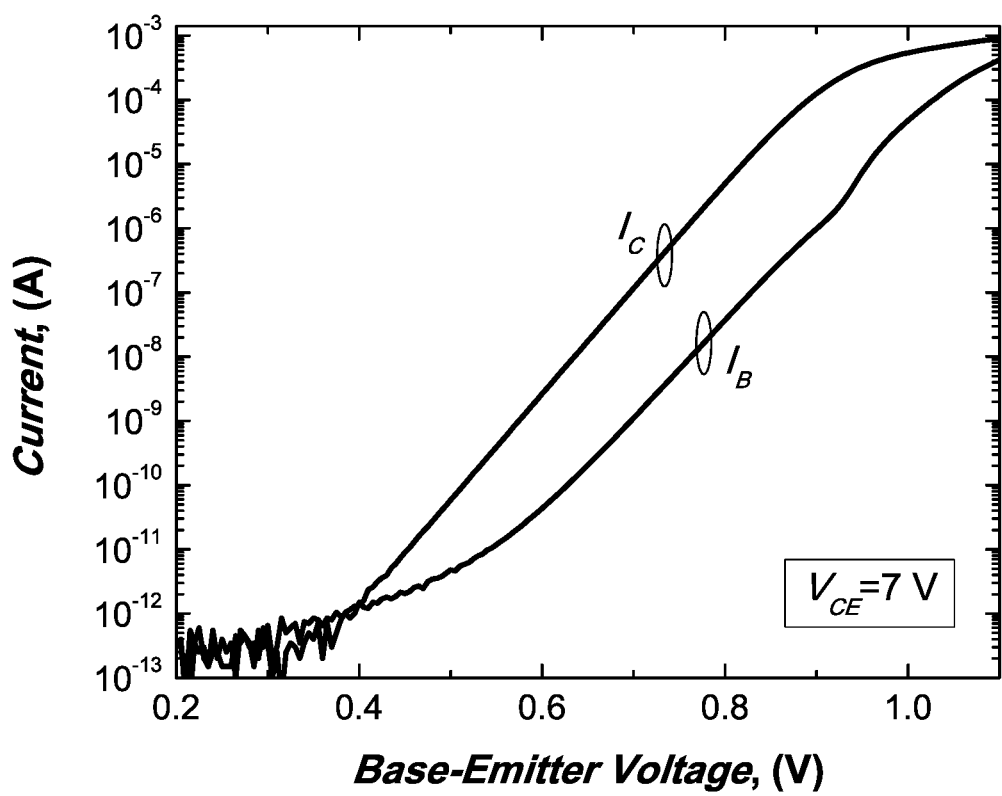
FIG. 3: Gummel characteristics of a transistor according to one embodiment.

Gummel characteristics of the HV SE HCBT are shown in FIG. 3. showing near ideal behavior down to very small currents. Electrons injected from the emitter diffuse through the base and enter the base-collector depletion region. Electric field associated with the extrinsic base—collector junction is pushing electrons downwards, whereas field associated with the local pwell substrate—collector junction is pushing electrons upwards and laterally towards the intrinsic base. Therefore electrons traveling through the base-collector depletion region are crowded somewhere in the middle. Since the electric field lines meet along the middle, this border is the plane of zero electric field because no field lines are crossing that border. Direction of the field forces electrons to flow there. Lateral component of the electric field is induced towards extrinsic collector forming the drift region. Therefore, electrons flow toward the extrinsic collector through the region with reduced electric field. After the full depletion of the intrinsic collector, the voltage drop across the intrinsic base-collector junction remains roughly constant and is not increased if the collector voltage is raised. Collector voltage is blocked by the extrinsic base and the local pwell substrate. Due to availability of donor charge in the extrinsic collector, the voltage is dropped in the drift region and the second peak of the electric field appears there and causes the transistor's breakdown, eventually. As in the case of DE HCBT [5], electric field at the curvature of the extrinsic base-collector junction near the top surface (see FIG. 1) is higher than the field in the drift region. Avalanche hole current that is generated at the extrinsic base-collector junction is injected to the emitter, which causes large back-injection of electrons from the emitter. These electrons flow through the base, then base-collector junction with limited electric field and through the drift region with reduced electric field ending up in the extrinsic collector. They do not flow through the junction which is the source of initial avalanche current. Therefore, positive feedback loop is not closed and $BV_{CEO}$ does not occur unless critical field appear on the current path in the drift region. Therefore, breakdown occurs either if hard breakdown at the extrinsic base-collector junction is reached or when the critical electric field appears in the drift region. In the later case, $BV_{CEO}$ occurs involving the classical positive feedback due to transistor current gain and in the former case $BV_{CBO}$ occurs, meaning that $BV_{CEO}$ is not observed. In that case measured breakdown voltage in the common-emitter output characteristics is actually $BV_{CBO}$.

Figure 4:
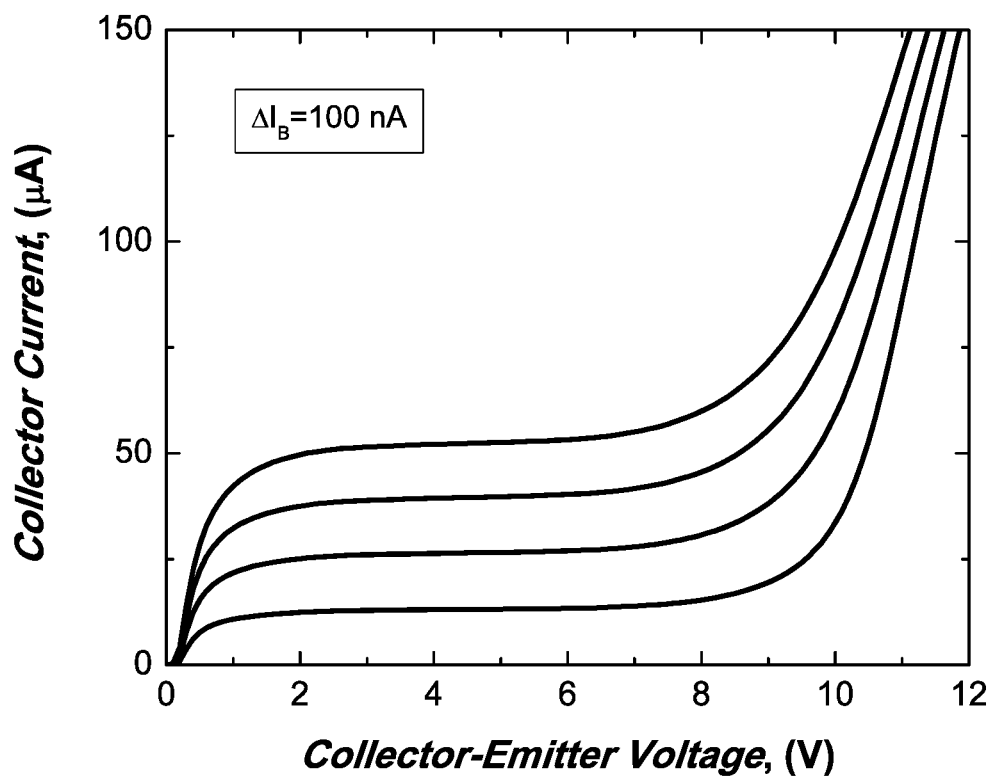
FIG. 4: Measured common emitter output characteristics of a transistor according to one embodiment.
Figure 5:
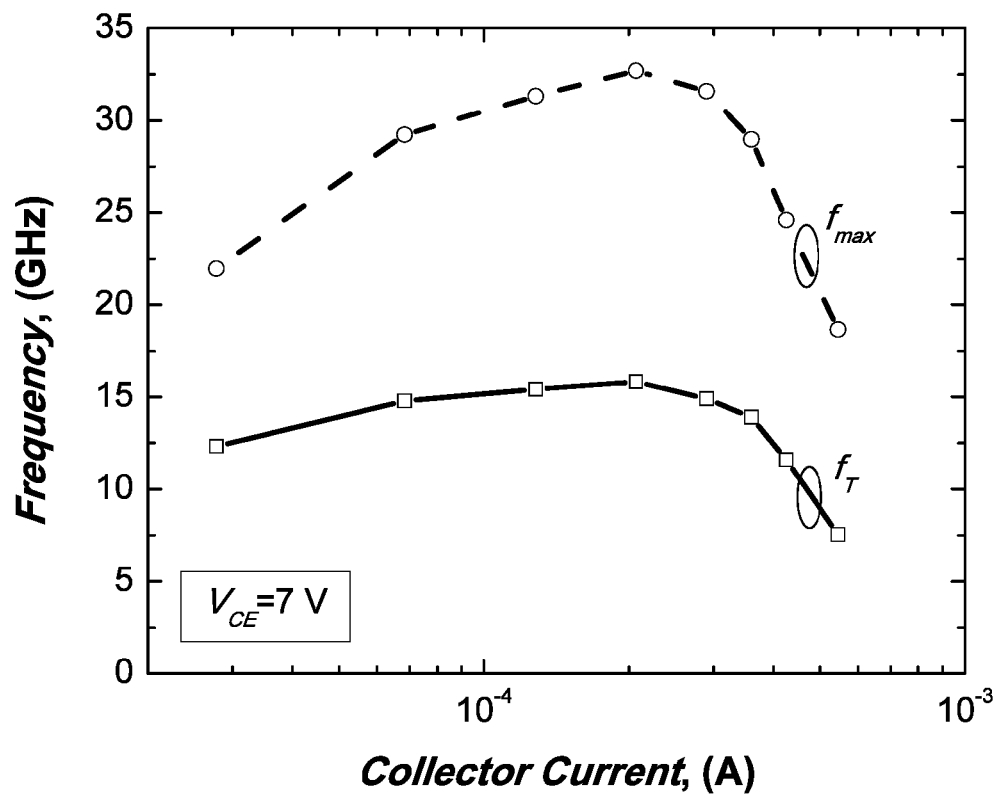
FIG. 5: Measured frequency characteristics of a transistor according to one embodiment.

Measured common emitter output characteristics of the HV SE HCBT are shown in FIG. 4. High common-emitter breakdown voltage ($BV_{CEO}$), and flat output characteristics are observed. Electrical characteristics of the HV SE HCBT and the high-speed (HS) HCBT are given in Table.1. $BV_{CEO}$ and $V_A$ are improved in case of HV SE HCBT. $BV_{CEO}$ of 10.5 V is measured by forced $V_{BE}$ method as listed in Table 1. Flatness of the output characteristics indicates suppression of the basewidth modulation as a result of the fully depleted collector. A high $V_A$ of 105 V is measured for $V_{CE}$ between 4 and 5 V. Since the intrinsic base is protected from punchthrough when the collector is fully depleted, the same thin implanted base profile as in other HCBT devices is used. As a result, high β of 133 and high $β·V_A$ of around 14 kV are obtained indicating transistor's high-performance for analog applications. Additionally, short base transit time is maintained resulting in high $f_T$ and $f_{max}$ of 15.8 and 32.7 GHz respectively (see FIG. 5.). Of course, the high frequency performance is degraded compared to the HS HCBT device due to aforementioned current crowding effects as well as the increased base-collector depletion region transit time. However a high value of $f_T BV_{CEO}$ of 166 GHzV is obtained, the result close to the Johnson's limit.

TABLE I

MEASURED ELECTRICAL PARAMETERS OF HIGH VOLTAGE SINGLE-EMITTER (HV SE) HCBT AND HIGH SPEED (HS) HCBT

|  | HV SE HCBT | HS HCBT |
|---|---|---|
| $β_{max}$ | 133 | 151 |
| $V_A$, (V) | 105 | 10.6 |
|  | ($V_{CE}$ = 4~5 V) |  |
| $BV_{CEO}$ (V) | 10.5 | 3.95 |
| (forced $V_{BE}$) |  |  |
| $f_T$ (GHz) | 15.8 | 35.7 |
| $f_{max}$ (GHz) | 32.7 | 61 |
| $f_T BV_{CEO}$ (GHzV) | 166 | 141 |
| $β · V_A$, (kV), | 13.97 | 1.6 |

II. The Second Embodiment

In the second embodiment local pwell substrate-collector junction 18 is used to change the electric field distribution of the DE HCBT.

Intrinsic part of the proposed structure is the same as in standard DE HCBT and is shown in FIG. 6A. Intrinsic bases 8 and emitters 10 are processed on two opposing sidewalls, whereas extrinsic bases are merged on top forming single extrinsic base 7. Extrinsic base layer 7, and base contact 15B make up a region defined as the base contact region. Extrinsic base layer 7 forms a metallurgical pn-junction with n-hill layer 5 and a metallurgical p+p junction with intrinsic base 8 as shown in FIG. 6A. Two intrinsic collectors are merged, and extrinsic collectors are folded to front and back in the plane perpendicular to the intrinsic transistor, which is shown in FIG. 6B in case of standard DE HCBT. In this way, low resistive path for setting the collector potential is achieved. Extrinsic base layer 7 extends laterally with respect to the intrinsic base layers as shown in FIG. 6B and FIG. 6C. This means that isometric projection of said extrinsic base layer on said wafer plane which is not intercepted with isometric projection of said intrinsic base layer on said wafer plane consists of at least one polygon having finite area larger than zero. As noted above, collector contact 15C and n+ diffusion layer 12 make up a region defined as the collector contact region. The intrinsic collector shown in the cross-section of FIG. 6A is surrounded by two intrinsic bases 8 from two sides as well as the extrinsic base 7 and the substrate 1 from the top and bottom, respectively. The basic idea is that the total intrinsic collector charge in the plane shown in FIG. 6A is confined in space and therefore can be changed by the geometry of the transistor. Since the vertical doping profile is set by the technology of HS HCBT, only the distance between two intrinsic bases can be changed to modulate total intrinsic collector charge. This can be easily accomplished by the design of lithography masks and without any additional processing. In forward active region of operation collector-base junction is reverse biased. For a certain voltage, depletion regions of two opposite junctions merge in the middle and the intrinsic collector is fully depleted. Further increase in the collector voltage causes the voltage drop toward extrinsic collector in direction perpendicular to the intrinsic transistor shown in cross-section in FIG. 6B. and drift regions DR1 are formed. Therefore, when intrinsic collector becomes fully depleted, voltage drop across the intrinsic base-collector junction is limited as well as the electric field. Due to the voltage drop across the drift region, electric field can be increased there causing the second peak of the electric field at the end of the drift region [5], which appears along the current path in the base-collector depletion region. If critical electric field is achieved along the current path, classical $BV_{CEO}$ breakdown involving positive feedback due to transistor gain occurs. If electric field at extrinsic base-collector junction rises to critical value for hard breakdown prior to critical field in the drift region, then $BV_{CBO}$ occurs and $BV_{CEO}$ does not occur. This can be controlled by transistor geometry and collector doping profile.

In the second embodiment presented here, the local pwell substrate-collector junction 18 is used to deplete top portion of the n-hill in order to limit the electric field which is formed in the drift region DR1 of DE HCBT. At the same time, the peak electric field at the curvature of the extrinsic base-collector junction near the top surface which is responsible for the $BV_{CBO}$ is limited as well. This is done in a similar manner as in RESURF devices and we will call this device DE HCBT with RESURF region.

Figure 7A:
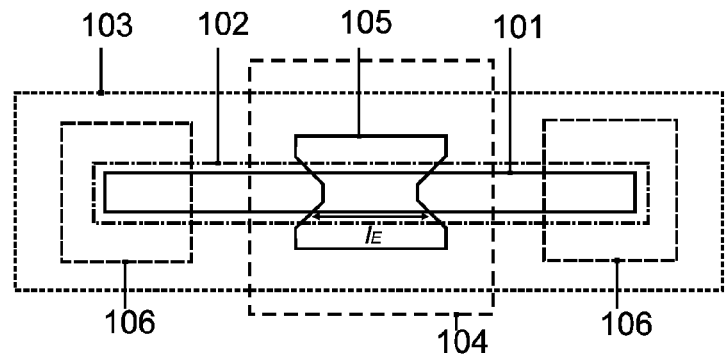
FIG. 7A: One example of a lithography mask for one embodiment.
Figure 7B:
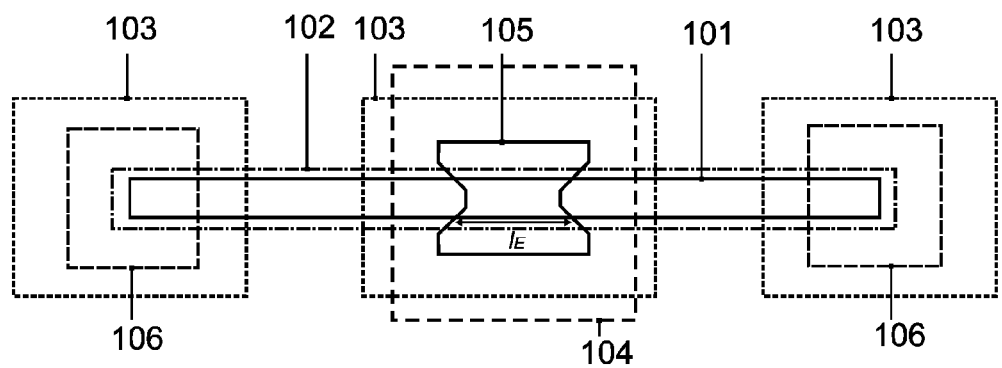
FIG. 7B: Another example of a lithography mask for one embodiment.

Cross-sections at the symmetry lines of the DE HCBT with RESURF region are shown in FIG. 6A and FIG. 6C. Cross-section along the middle of the n-hill 5 is shown in FIG. 6C. Since the structure is symmetrical with respect to the base contact, only one half is shown. Compared to standard DE HCBT shown in FIG. 6B this one has extended extrinsic collector under which CMOS pwell is implanted, which serves as a local substrate 4A with increased doping concentration. As shown in FIG. 6C, this pwell substrate 4A is placed locally and it does not extend all the way below the intrinsic bases 8. Therefore, the intercept between an isometric projection of said intrinsic base layer on said wafer plane and an isometric projection of said buried local pwell substrate on said wafer plane is smaller than said isometric projection of said intrinsic base layer. The local pwell substrate can be extended all the way below n+ diffusion layer 12 but better electrical performance is achieved if it is not completely extended. If local pwell substrate 4A is not extended below n+ diffusion layer 12 then the intercept between an isometric projection of said n+ diffusion layer on said wafer plane and an isometric projection of said buried local pwell substrate on wafer plane is smaller than said isometric projection of said n+ diffusion layer. Pwell implant is also used as a channel stopper in all HCBT devices, which is shown in the cross-section in FIG. 6A. Lithography masks important for the standard DE HCBT and DE HCBT with RESURF region are shown in FIG. 7A and FIG. 7B. The same mask set and the same process is used for all HCBT structures.

In normal operation substrate is connected to the ground potential. By increasing the collector voltage, junction between local pwell substrate 4A and n-hill 5 is reversely polarized. The basic idea is that the n-hill above the local pwell substrate is fully depleted if collector voltage is increased and that the second drift region DR2 (FIG. 6C) is formed.

Figure 8A:
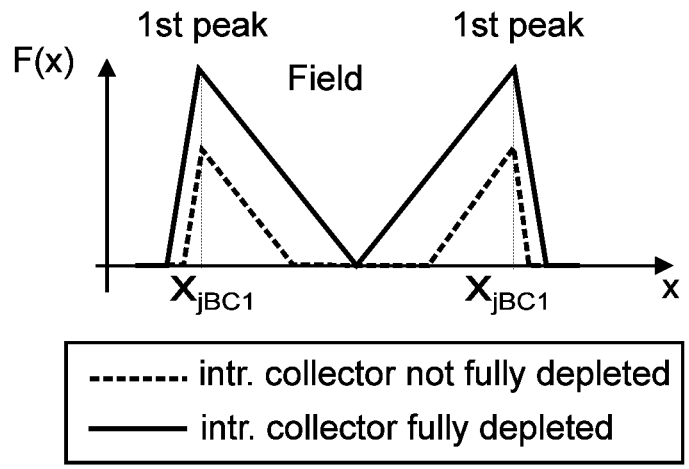
FIG. 8A: Electric field profile along one path through a transistor according to one embodiment.
Figure 8B:
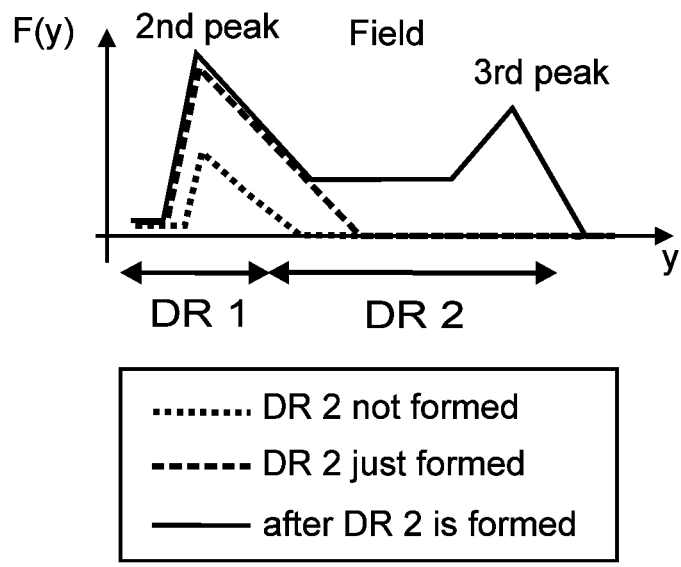
FIG. 8B: Electric field profile along another path through a transistor according to one embodiment.

The change of the electric field with the increase of the collector-emitter voltage ($V_{SE}$) is shown in FIG. 8A and FIG. 8B. For small $V_{CE}$, peak electric field at the intrinsic base-collector junction increases with $V_{CE}$ as shown in FIG. 8A and depletion regions spread into the intrinsic collector. After intrinsic collector is fully depleted, there is no available donor charge in this cross-section (FIG. 6A) and maximum electric field at junctions remains unchanged. The voltage is dropped in the perpendicular cross-section across the $1^{st}$ drift region (DR 1 in FIG. 6C) toward extrinsic collector. Electric field along the current path at the middle of the n-hill is shown in FIG. 8B. As the $V_{CE}$ is increased, the $2^{nd}$ peak of the electric field appears in DR 1, whereas the $1^{st}$ peak at the intrinsic base-collector junction (FIG. 8A) remains the same because collector voltage is blocked by the extrinsic base extensions above DR 1 [5]. Further increase in $V_{CE}$ increases the $2^{nd}$ peak up to the voltage for which extrinsic collector above local pwell substrate becomes fully depleted and the $2^{nd}$ drift region (DR 2) is formed. Additional increase in $V_{CE}$ causes the voltage drop across the DR 2. Collector voltage is partially blocked by the pwell region reducing its impact on the value of the electric field $2^{nd}$ peak. Since there is enough available charge in the extrinsic collector, the $3^{rd}$ peak of the electric field appears at the end of the DR 2 (FIG. 8B). The ability of the pwell region to block the collector voltage determines weather the critical field first appears in the $2^{nd}$ or the $3^{rd}$ peak of the electric field resulting in different values of $BV_{CEO}$. This can be controlled by the collector concentration in the DR 2 and the length of DR 2. Another result of the formation of DR2 and its ability to block the collector voltage is that the peak electric field responsible for $BV_{CBO}$, which is placed at the extrinsic base-collector junction, is limited as well.

Electrical Characteristics

Figure 9:
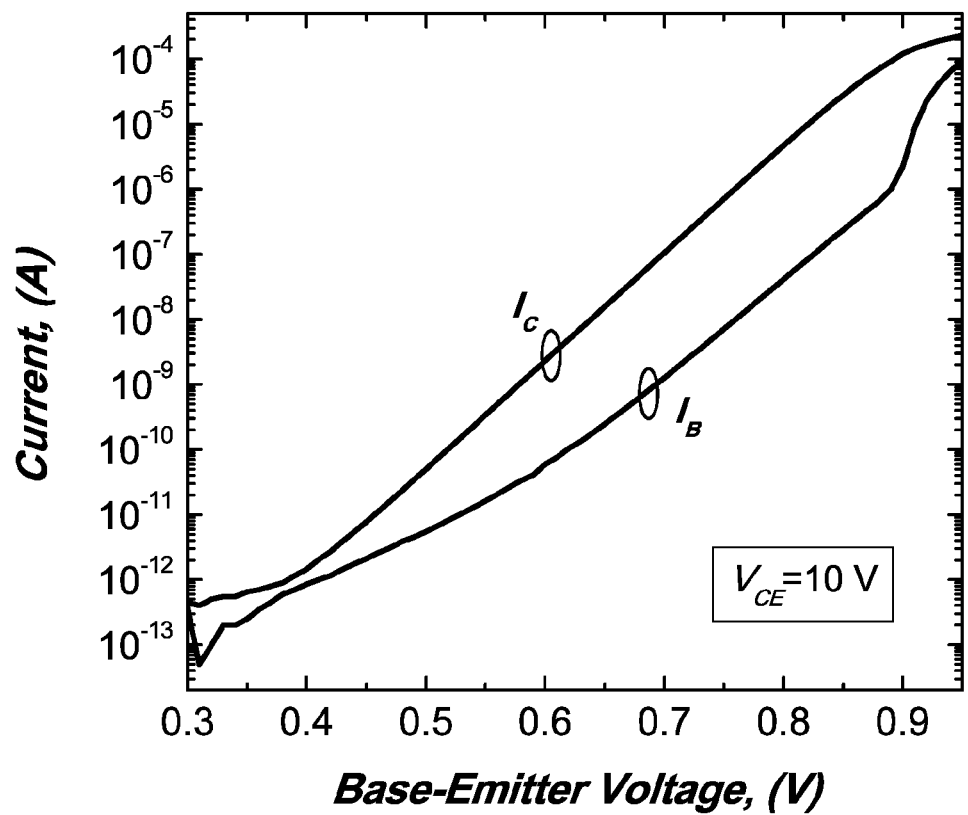
FIG. 9: Gummel characteristics of a transistor according to another embodiment.
Figure 10:
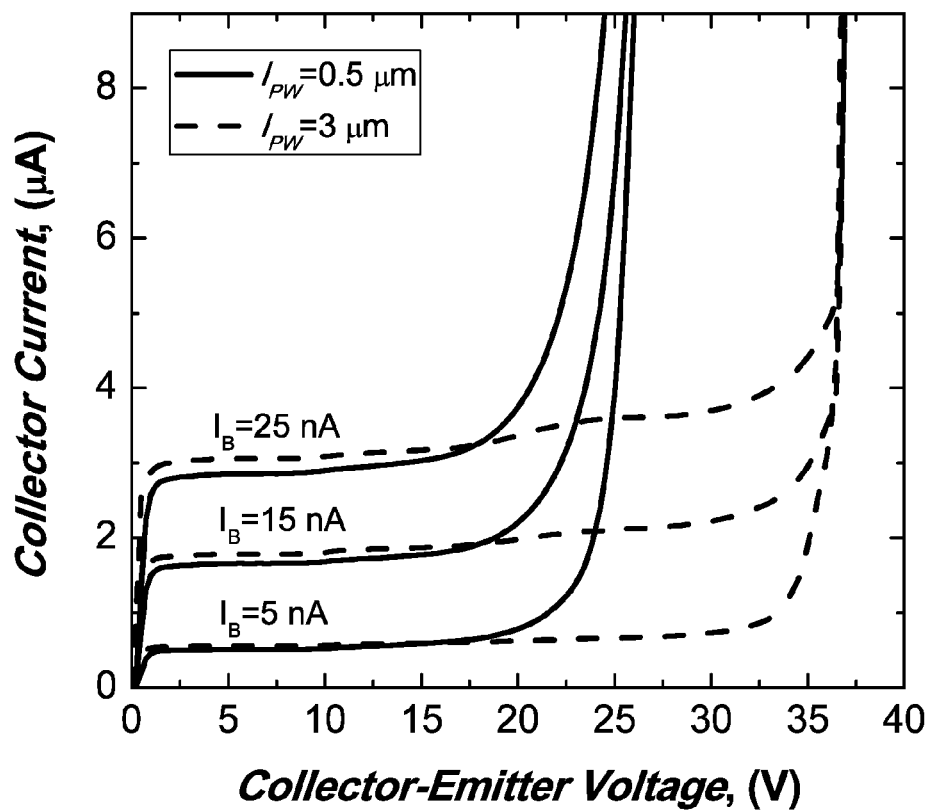
FIG. 10: Measured common emitter output characteristics of transistors according to another embodiment.

Gummel characteristics of the transistor with the length of local pwell substrate (i.e. DR 2 from FIG. 6C) $l_{pw}$=0.5 µm is shown in FIG. 9. Measured common emitter output characteristics of fabricated transistors with different $l_{pw}$ are shown in FIG. 10. Breakdown occurs around 26 V for the transistor with $l_{pw}$=0.5 µm and around 36 V for transistor with $d_{pw}$=3 µm. Summary of electrical characteristics is given in Table II.

TABLE II

MEASURED ELECTRICAL PARAMETERS OF DOUBLE-EMITTER (DE) HCBT WITH RESURF R REGION FOR N-HILL WIDTH OF 0.36 µm AND DIFFERENT LENGTH $d_{pw}$.

| Emitter area (µm$^2$) | $l_{pw}$ = 0.5 µm | $l_{pw}$ = 3 µm |
|---|---|---|
| $\beta_{max}$ | 123 | 129 |
| $V_A$, (V), ($I_B$ = 15 nA) | 1928 | 2233 |
|  | ($V_{CE}$ = 6~7 V) | ($V_{CE}$ = 6~7 V) |
| $BV_{CEO}$ (V), output | 26 | 36 |
| $BV_{CS}$ (V) | 33 | 36 |
| $f_T$ (GHz) | 5.26 | 2.68 |
| $f_{max}$ (GHz) | 10.55 | 4.55 |
| $f_T BV_{CEO}$ (GHzV) | 137 | 164 |
| $\beta \cdot V_A$, (kV), | 2.37 | 2.88 |

Figure 11:
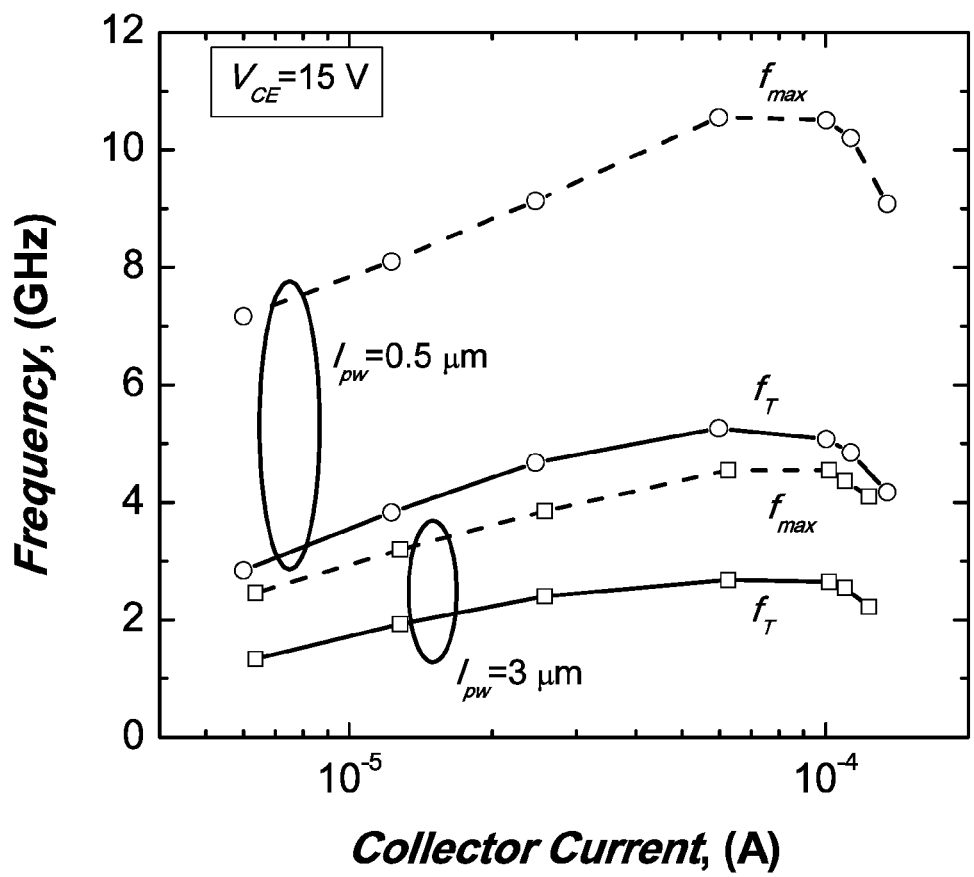
FIG. 11: Dependence of cut-off frequency and maximum oscillation frequency on collector current for one embodiment

In case of transistor with $l_{pw}$=0.5 µm classical $BV_{CEO}$ occurs between collector and emitter and in the case of transistor with $l_{pw}$=3 µm, the breakdown occurs between local pwell substrate and n-hill and basically transistors' $BV_{CEO}$ which involves positive feedback due to transistor current gain is not observed. This means that neither the $2^{nd}$ nor the $3^{rd}$ peak from FIG. 8B. generate holes which can close the positive feedback loop and cause $BV_{CEO}$. The $2^{nd}$ peak is limited below critical value for avalanche, whereas holes generated at the $3^{rd}$ peak are collected by the substrate since they have to travel through the DR2 to end up in the extrinsic base, which is less probable for structure with $l_{pw}$=3 µm than for structure with $l_{pw}$=0.5 µm, because strong vertical electric field component acts in the DR2. This is confirmed by the measurement of collector-substrate breakdown voltage ($BV_{CS}$) which equals $BV_{CEO}$ measured from the output characteristics for the structure with $l_{pw}$ 3 µm, meaning that breakdown voltage observed in the output characteristics is actually $BV_{CS}$. In case of $l_{pw}$=0.5 µm transistor $BV_{CS}$ is slightly smaller compared to transistor with $l_{pw}$=3 µm due to smaller distance between local pwell substrate and n+ diffusion layer. Intrinsic base-collector junction is electrostatically shielded and basewidth modulation is suppressed resulting in very large value of Early voltage, which equals around 1.93 kV and 2.23 kV for transistor with $l_{pw}$=0.5 µm and $l_{pw}$=3 µm, respectively. Since the value of current gain β is high, considering that transistor has implanted base, the $β·V_A$ product is remarkable. Dependence of cut-off frequency ($f_T$) and maximum oscillation frequency ($f_{max}$) on collector current are shown in FIG. 11. In this structure, speed is traded for higher BV and $f_T$ and $f_{max}$ are reduced accordingly. Nevertheless, $f_T·BV_{CEO}$ products show results close to the Johnson's limit.

DESCRIPTION OF SYMBOLS

1: Silicon substrate
2: Shallow trench isolation (device isolating oxide film)
3: CMOS nwell
4A: Local pwell substrate
4B: CMOS pwell layer
5: n-hill layer
6: CMOS gate polysilicon
7: Extrinsic base layer
8: Intrinsic base layer
9: Emitter polysilicon
10: Emitter diffusion layer
11: Sidewall spacer
12: n+ diffusion layer
13: p+ diffusion layer
14: Silicide
15A: Emitter contact
15B: Base contact
15C: Collector contact
15D: Substrate contact
16: First metallurgical pn junction
17: Second metallurgical pn junction
18: Third metallurgical pn junction
101: CMOS active mask
102: n-hill mask
103: CMOS pwell-block mask
104: Base mask
105: Oxide etching mask
106: CMOS n+ collector mask

REFERENCES

[1] T. Suligoj et al, U.S. Pat. No. 7,038,249, 2006
[2] T. Suligoj, P. Biljanovic, J. K. O. Sin, K. L. Wang. "A New HCBT with a Partially Etched Collector", IEEE Electron Dev. Letters, Vol. 26, No. 3, pp. 200-202, March 2005
[3] T. Suligoj et al, U.S. Pat. No. 8,569,866, 2013 "Hybrid-integrated lateral bipolar transistor and CMOS transistor and method for manufacturing the same"
[4] T. Suligoj, M. Koričić, H. Mochizuki, S. Morita, K. Shinomura, and H. Imai, "Horizontal Current Bipolar Transistor (HCBT) with a Single Polysilicon Region for Improved High-Frequency Performance of BiCMOS ICs," IEEE Electron Device Lett., vol. 31, no. 6, pp. 534-536, June 2010.
[5] M. Koričić, T. Suligoj, H. Mochizuki, S. Morita, K. Shinomura, and H. Imai, "Double-Emitter HCBT Structure—A High-Voltage Bipolar Transistor for BiCMOS Integration,", IEEE Trans. Electron Devices, vol. 59, no. 12 pp. 3647-3650, December 2012.
[6] J. A. Appels, and H. M. J Vaes, "High Voltage Thin Layer Devices (RESURF Devices)," in IEDM Tech. Dig., 1979, pp. 238-241.
[7] J. Cai, M. Kumar, M. Steigenvalt, H. Ho, K. Schonenberg, K. Stein, H. Chen, K. Jenkins, Q. Ouyang, P. Oldiges, and T. Ning, "Vertical SiGe-Base Bipolar Transistors on CMOS-Compatible SOI Substrate", BCTM 2003, pp. 215-218.

The invention claimed is:

1. A horizontal current bipolar transistor comprising:
a substrate having a first conductivity type and defining a wafer plane parallel to said substrate;
an n-hill layer disposed on top of said substrate, having a second conductivity type opposite to said first conductivity type, and forming a first metallurgical pn-junction with said substrate;
a n+ diffusion layer having second conductivity type disposed on top of said substrate and adjacent to said n-hill layer;
a base layer comprising an extrinsic base layer, an intrinsic base layer, and a sidewall inclined at an acute angle to said wafer plane, having first conductivity type, and forming a second metallurgical pn-junction with said n-hill layer;
a buried local pwell substrate having first conductivity type disposed between said substrate and said n-hill layer forming a third metallurgical pn-junction with the n-hill layer;
wherein a first intercept between an isometric projection of said base layer on said wafer plane and an isometric projection of said buried local pwell substrate on said wafer plane is smaller than said isometric projection of said base layer.

2. The horizontal current bipolar transistor of claim 1, wherein a second intercept between an isometric projection of said n+ diffusion layer on said wafer plane and an isometric projection of said buried local pwell substrate-on wafer plane is smaller than said isometric projection of said n+ diffusion layer.

3. The horizontal current bipolar transistor of claim 1, wherein at least one CMOS pwell layer of first conductivity type is disposed within said substrate and at least one MOS type transistor is disposed within said CMOS pwell layer.

4. The horizontal current bipolar transistor of claim 3, wherein said buried local pwell substrate and said CMOS pwell layer exhibit substantially equal impurity dopant distribution decay towards the substrate.

5. The horizontal current bipolar transistor of claim 1, further described as having a collector-emitter breakdown voltage, wherein for at least one value of collector-emitter voltage smaller than said collector-emitter breakdown voltage, a depletion region extends at least from said second metallurgical pn-junction to said third metallurgical pn-junction.

6. The horizontal current bipolar transistor of claim 1, further described as having a collector-emitter breakdown voltage, wherein for at least one value of collector-emitter voltage smaller than said collector-emitter breakdown voltage, a depletion region extends at least from said first metallurgical pn-junction to said second metallurgical pn-junction.

7. A horizontal current bipolar transistor comprising,
a substrate having a first conductivity type and defining a wafer plane parallel to said substrate;
an n-hill layer disposed on top of said substrate, having a second conductivity type opposite to said first conductivity type, forming a first metallurgical pn-junction with said substrate; and surrounded by isolating oxide layer;
at least one n+ diffusion layer having second conductivity type disposed on top of said substrate and adjacent to said n-hill layer;
an intrinsic base layer disposed on top of said n-hill layer and comprising a portion of at least one of two opposing sidewalls inclined at an acute angle to said wafer plane, having first conductivity type, and forming a second metallurgical pn-junction with said n-hill layer;
an extrinsic base layer disposed on top of the n-hill layer, having first conductivity type and forming a third metallurgical pn-junction with said n-hill layer and metallurgical p$^+$p junction with said intrinsic base layer;
a buried local pwell substrate having first conductivity type disposed between said substrate and said n-hill layer forming a fourth metallurgical pn-junction with said n-hill layer;
wherein a first intercept between an isometric projection of said intrinsic base layer on said wafer plane and an isometric projection of said buried local pwell substrate on said wafer plane is smaller than said isometric projection of said intrinsic base layer;
wherein isometric projection of said extrinsic base layer on said wafer plane not intercepted with isometric projection of said intrinsic base layer on said wafer plane consists of at least one polygon having finite area larger than zero.

8. The horizontal current bipolar transistor of claim 7, wherein a second intercept between an isometric projection of said n+ diffusion layer on said wafer plane and an isometric projection of said buried local pwell substrate on wafer plane is smaller than said isometric projection of said n+ diffusion layer.

9. The horizontal current bipolar transistor of claim 7, wherein at least one CMOS pwell layer of first conductivity type is disposed within said substrate and at least one MOS type transistor is disposed within said CMOS pwell layer.

10. The horizontal current bipolar transistor of claim 9, wherein said buried local pwell substrate and said CMOS pwell layer exhibit substantially equal impurity dopant distribution decay towards the substrate.

11. The horizontal current bipolar transistor of claim 7, further described as having a collector-emitter breakdown voltage, wherein for at least one value of collector-emitter voltage smaller than said collector-emitter breakdown voltage, a depletion region extends at least from said third metallurgical pn-junction to said fourth metallurgical pn-junction.

12. The horizontal current bipolar transistor of claim 7, further described as having a collector-emitter breakdown voltage, wherein for at least one value of collector-emitter voltage smaller than said collector-emitter breakdown voltage, a depletion region extends at least from said first metallurgical pn-junction to said second metallurgical pn-junction.

13. The horizontal current bipolar transistor of claim 7, further described as having a collector-emitter breakdown voltage, wherein for at least one value of collector-emitter voltage smaller than said collector-emitter breakdown voltage, a depletion region extends at least from said first metallurgical pn-junction to said third metallurgical pn-junction.

14. The horizontal current bipolar transistor of claim 7, further described as having a collector-emitter breakdown voltage, wherein for at least one value of collector-emitter voltage smaller than said collector-emitter breakdown voltage, a depletion region extends at least from said fourth metallurgical pn-junction to said wafer plane.

15. The horizontal current bipolar transistor of claim 7, further described as having a collector-emitter breakdown voltage, wherein for at least one value of collector-emitter voltage smaller than said collector-emitter breakdown voltage, a depletion region extends at least from said first metallurgical pn-junction to said wafer plane.

* * * * *